United States Patent [19]

Park et al.

[11] Patent Number: 5,543,253
[45] Date of Patent: Aug. 6, 1996

[54] PHOTOMASK FOR T-GATE FORMATION AND PROCESS FOR FABRICATING THE SAME

[75] Inventors: Byung-Sun Park, Yusong-ku; Yong-Ho Oh, Joong-ku; Sang-Soo Choi; Hyung-Joun Yoo, both of Yusong-ku, all of Rep. of Korea

[73] Assignee: Electronics & Telecommunications Research Inst., Daejeon, Rep. of Korea

[21] Appl. No.: 357,017

[22] Filed: Dec. 16, 1994

[30] Foreign Application Priority Data

Aug. 8, 1994 [KR] Rep. of Korea ............... 94-19493

[51] Int. Cl.$^6$ ............................................. G03F 9/00
[52] U.S. Cl. ..................... 439/5; 430/311; 437/40; 437/44
[58] Field of Search ................ 430/5, 311; 437/40, 437/44

[56] References Cited

U.S. PATENT DOCUMENTS 4,959,326  9/1990  Roman et al. ................... 437/40
5,102,815  3/1992  Sanchez ........................... 437/44
5,155,053  10/1992  Atkinson ........................ 437/40
5,405,721  4/1995  Pierrat ............................ 430/5

*Primary Examiner*—S. Rosasco
*Attorney, Agent, or Firm*—Larson and Taylor

[57] ABSTRACT

The present invention relates to a photomask for forming a T-shaped gate structure on a high speed FET through a photolithography, comprising opaque layer patterns 2 and 2a for defining a head portion of the T-shaped gate structure and half-tone layer patterns 3 and 3a for defining a foot portion thereof.

The half-tone film patterns composed of a chrome layer are deposited to a thickness thinner than that of the opaque layer patterns so that the half-tone layer patterns show a relatively lower transmittance to an incident beam.

The application of the photomask of the invention to the process for forming a T-shaped gate structure improves process reproducibility and leads to great cost savings.

3 Claims, 6 Drawing Sheets

PHOTOMASK FOR T-GATE FORMATION AND PROCESS FOR FABRICATING THE SAME

BACKGROUND OF THE INVENTION

1. Field of the Invention

The present invention relates to the formation of a gate electrode on a semiconductor device, and more particularly to a photomask for forming a T-shaped gate structure on a FET and a process for fabricating the same.

2. Description of the Related Art

Recently, in order to carry the high modulation performance in high-speed devices such as a high electron mobility transistor (HEMT) being applicable mainly to a satellite broadcasting receiver, a high-speed logic circuit, a power module, MMIC and the like, not only short gate lengths but also large cross-sectional areas for allowing massive current flow are needed. To comply with these conditions, a T-shaped gate structure that looks like the letter "T" has been used.

Meanwhile, in case the T-shaped gate is formed by a photolithography, it is not sufficient to form a gate pattern having a width of less than 0.25 microns due to the limitation of resolution of the photolithography per se.

Thus, a T-shaped gate structure has been generally formed using an electron beam lithography, in which two layers of electron-beam resists, each having a different sensitivity, is deposited and then patterned to form the T-gate structure.

That is, the bottom layer is a low sensitivity polymethyl methacrylates (PMMA) for an electron-beam while the top layer is formed by a high sensitivity methyl methacrylate (MMA) for the electron-beam.

This typical technique will be described in detail in conjunction with the accompanying drawings.

DETAILED DESCRIPTION OF THE PREFERRED EMBODIMENT

Now referring to FIGS. 3(a) to (f), there are illustrated sequential steps of a conventional process for forming a T-shaped gate structure using an electron beam lithography.

Figure 3A:
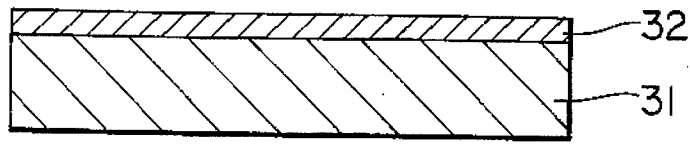
FIGS. 3(a) to (f) are the cross sectional views showing a process flow for forming a T-shaped gate structure according to a prior art.
Figure 3B:
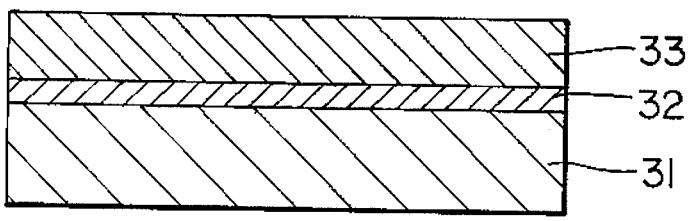

As shown in FIG. 3(a), a PMMA resist 32 (hereinafter, mentioned as 'a bottom resist') is deposited over a substrate 31 and then the deposited substrate is baked (hereinafter, this step will be mentioned as soft-dry baking step) in order to improve adhesiveness between the bottom resist 32 and the substrate 31. Subsequently, as shown in FIG. 3(b), a MMA resist 33 (hereinafter, mentioned as 'a top resist') is deposited over the bottom resist 32 and then soft-dry baked.

Figure 3C:
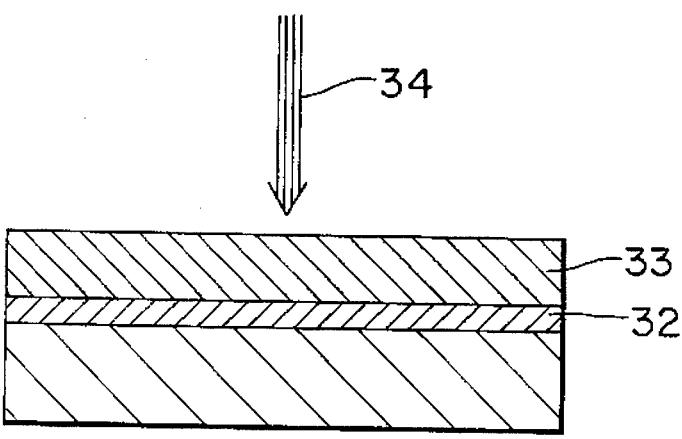

As shown in FIG. 3(c), an electron beam having a predetermined current density is scanned upon the respective top and bottom resists 33 and 32 and then the thus scanned substrate is developed by immersion in a liquid solvent developer.

At this time, since both the top and bottom resists are positive resists, only the portions of the resists upon which the electron beam was scanned is resolved.

Figure 3D:
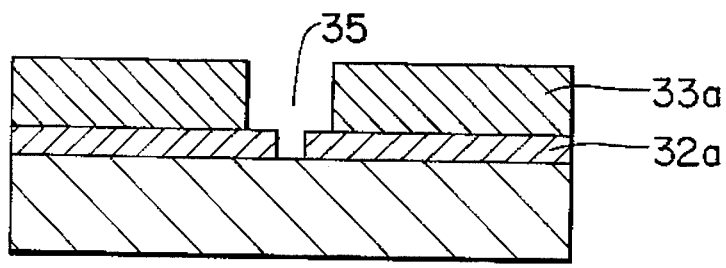

As a result, as shown in FIG. 3(d), the top and bottom resists in which a T-shaped notch 35 is formed can be obtained.

Within the top and bottom layers, the width of each resultant resist after the development is different from each other thus to form the T-shaped notch. This is because the sensitivities of the top and bottom are different even if the electron beam of same current density is illuminated upon each resist.

Figure 3E:
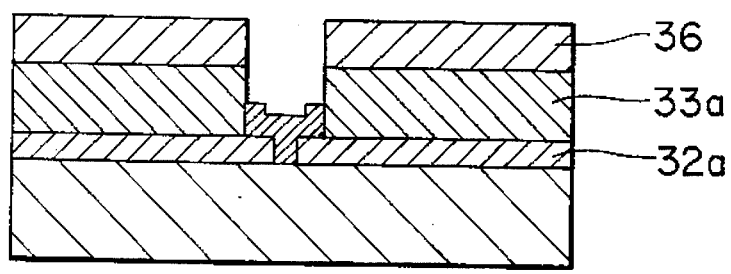

Next, as shown in FIG. 3(e), the substrate as treated is rinsed and subjected to a $O_2$ plasma descum, and then a metal is deposited upon the T-shaped resist patterns 33a and 32a to form a metal layer 36.

Figure 3F:
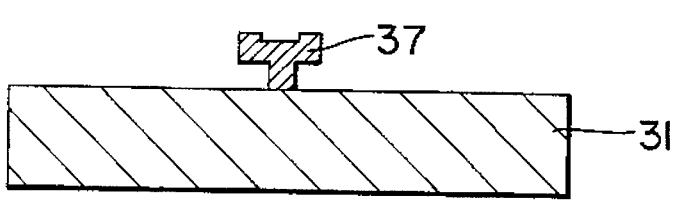

The resist patterns 33a and 32a and the metal layer 36 formed thereon are finally removed, as shown in FIG. 3(f), to form the T-shaped gate structure 37.

However, in a conventional electron beam lithographic technique, the time required for the exposing of the beam in order to form the resist pattern is much longer and this results in relatively lower production rate. And further the longer use of the tool may produce fluctuations in the current density of the beam, thus directly influencing on the notch width.

Another procedural problem is that, during the formation of the double layers, heat produced upon depositing a metal causes the diffusion of metal between the top and bottom layers.

In addition to the above problems associated with the formation of the resist pattern itself, when a conventional optical stepper is used for improving the throughput except for the step of forming T-gate structure, there may occur a discrepancy between an alignment method of the electron-beam lithographic tool and that of the optical stepper, thereby leading to errors in the mask registration in the semiconductor device process.

Unlike the above described electron-beam lithographic technique, the process for forming the T-gate structure using a photolithography has been also disclosed lately.

The prerequisites for forming the T-gate structure using the photolithographic technique are to develop a photolithographic tool having a capacity of line delineation less than 0.25 μm, along with the procedural technique for improving the resolution of the mask.

Lately, a photolithographic tool and the related procedural techniques having a such fine-line delineation capacity, which are the key to the formation of T-gate structure, have been developed. For this purpose, for an example, there are a stepper using short-wavelength light source such as a KrF excimer laser stepper and a related mask such as a phase shift mask for improving a resolution.

According to the known T-gate forming method using a conventional photolithography, an isolated space pattern is first formed using a phase shift mask and the pattern is cured, and then another resist is again deposited upon the cured resist. After subsequent exposure and developing cycles, a T-shaped notch is formed.

This method will be described in detail in respect of FIGS. 4(a) to (h), where the process flow for forming the T-gate structure using negative photoresists is illustrated.

Figure 4A:
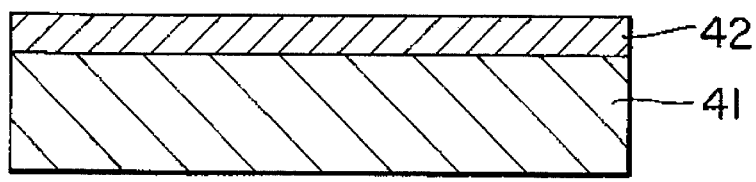
FIGS. 4(a) to (h) are the cross sectional views showing a process flow for forming a T-shaped gate structure according to another prior art.
Figure 4B:
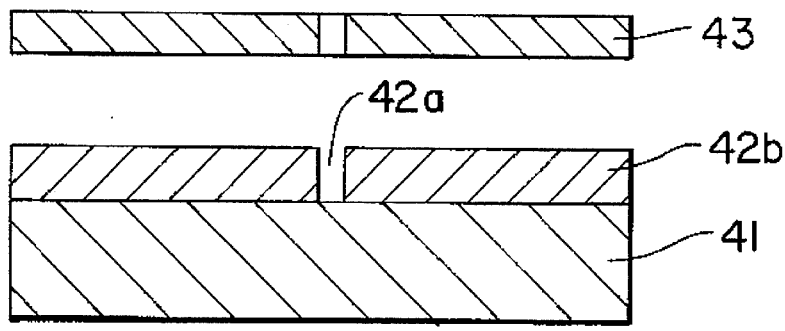
Figure 4C:
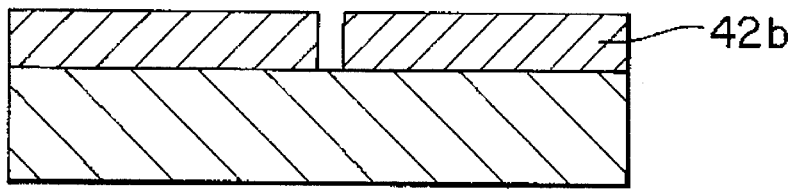
Figure 4D:
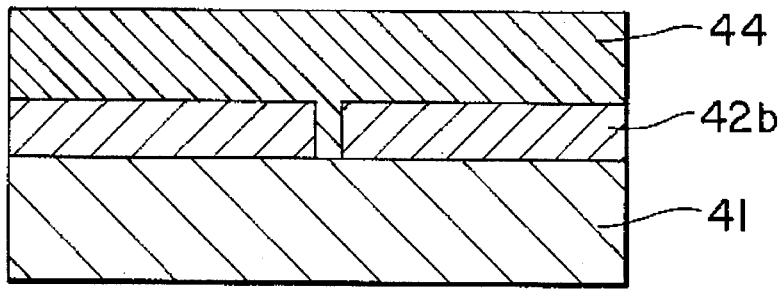

Referring now to FIG. 4(a), a negative photoresist 42 (hereinafter, mentioned as 'a bottom resist') such as a Kodak 747 or the like is deposited over a substrate 41 and then the substrate is pre-baked prior to the exposure (hereinafter, this step will be mentioned as 'soft-dry baking step') for softly drying the substrate.

Next, the bottom layer 42 is exposed through a first mask 43 which defines the width of the foot portion of the T-gate structure and then is developed to form a resist pattern 42b (hereinafter, mentioned as 'a first resist pattern') having a notch 42a which corresponds to the foot portion.

Then, as shown in FIG.4 (c), the substrate on which the first resist pattern was deposited is post-baked (hereinafter, this step will be mentioned as 'cure baking step'). Next, another negative resist 42b (hereinafter, mentioned as 'a top resist') is deposited upon the first resist 42b and then soft-dry baked. Upon the deposition of the top resist 44, the notch 42a of the first resist pattern 42b is also filled.

Figure 4E:
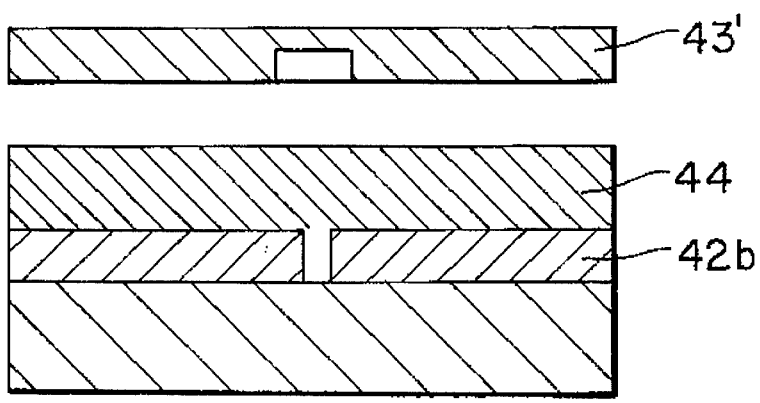

Next, as shown in FIG. 4(e), the top resist 44 is exposed through a second mask 43' which defines the width of the head portion of the T-gate structure. The above second mask 43' being used is a phase-shift mask.

By using the second mask 43', the region corresponding to the width of the head portion of the T-gate structure becomes opaque to an incident beam so that a pattern of isolated region can be formed in the following step on which the top resist 44 will be developed.

Figure 4F:
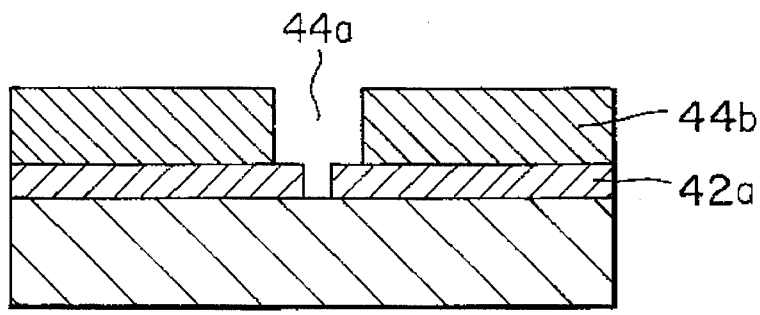

Referring to FIG. 4(f), the top resist 44 is then developed to form a patterned resist 44b (hereinafter, mentioned as 'a second resist pattern') having a notch and then the substrate as formed is subsequently subjected to a cure baking step and the residuals that remain thereon is removed by the following rinsing step.

Note that during the development of the top resist 44, the resist that was filled in the notch 42a is also etched away because this etched portion is positioned within the isolated region to be opaque.

Thus, a T-shaped notch 44a, which will serve for the T-shaped gate metal structure, is formed.

Figure 4G:
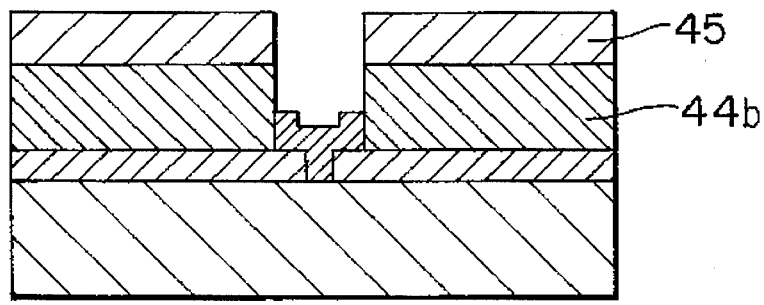

As shown in FIG. 4(g), a metal is then deposited over the second resist pattern 44b to form a metal layer 45.

Figure 4H:
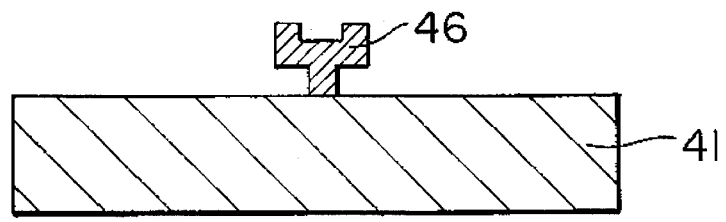

By removing the first and second resist patterns 42b and 44b and the metal layer 45 formed on the second resist pattern 44b, the T-gate structure 46 is finally formed as shown in FIG. 4(h).

Nevertheless, as appreciated in the above descriptions, one disadvantage of this process for forming the gate structure using the photolithography is that when negative resist is used for the formation of an isolated region, it produces swelling during the developing step, thus deteriorating the resolution, compared with the case of positive resist.

Furthermore, since the negative resist itself is based on a cross-linking mechanism of a polymer, some residuals can remain even after the development step and thus additional step such as a O₂ plasma descum is required to remove them. Accordingly, the line width of the T-gate structure can be widened by the procedures.

And Further, during the curing step of a resist, residuals produced between the layers deteriorate device quality and lead to loss of process reproducibility.

It is therefore an object of the present invention during the formation of resist-pattern for a T-gate structure to provide a photomask for forming a resist pattern through a photolithographic technique using a single exposure step upon a single resist, and a process using the photomask.

The photomask in accordance with the present invention for forming the T-gate structure is characterized in that the transmittance of beam passing through the photomask is selectively controlled.

Now, referring to the corresponding drawings, the present invention will be described in detail.

Figure 1A:
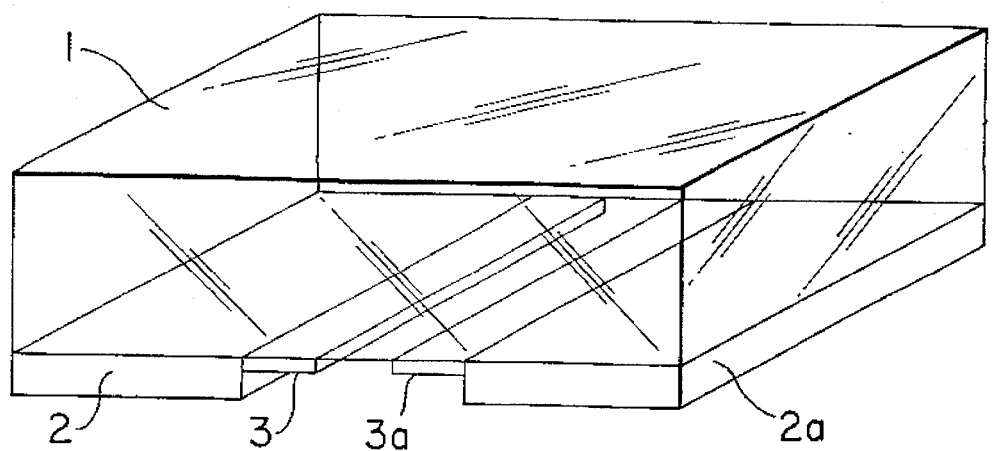
FIG. 1(a) is a perspective view of a photomask according to the present invention.

FIG. 1(a) shows a perspective view of the photomask for forming T-gate structure according to the present invention.

As shown in FIG. 1(a), the photomask of the present invention comprises a transparent quartz plate 1; two opaque layer patterns 2 and 2a, each pattern being positioned on said quartz plate 1 to a predetermined distance from the edges of said quartz plate in its inward direction, for completely blocking an incident beam to define a head portion of said T-shaped gate structure; and two half-tone layer patterns 3 and 3a, each pattern being positioned on said quartz plate 1 to a predetermined distance from the edges of said two opaque film patterns in its inward direction, for passing an incident beam with a lower transmittance than that of said transparent quartz plate 1 to define a foot portion of said T-shaped gate structure. The above opaque layer patterns 2 and 2a can be comprised of mask pattern materials such as Cr, Fe₂O₃ and the like, which are typically used for the formation of the photomask, or other opaque materials for forming films.

While the half-tone layer patterns 3 and 3a is composed of the same materials as those of the mask pattern, note that the thickness thereof is much thinner than that of the opaque layer patterns 2 and 2a.

Additionally, these half-tone layer patterns may be also composed of other half-tone materials such as a half-tone polymer.

Figure 1B:
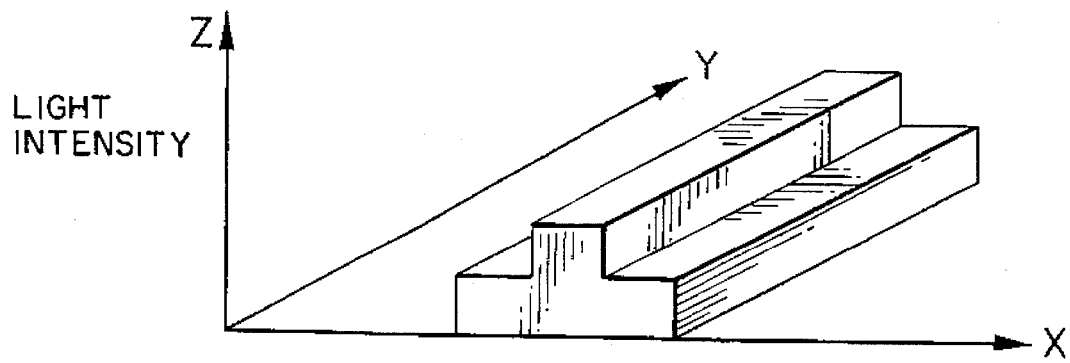
FIG. 1(b) is an intensity distribution of a beam passing through the photomask of the invention.

FIG. 1(b) shows an intensity distribution as a beam passes through the photomask according to the present invention having such a T-gate structure as described above.

As shown, the light intensity is the highest at the foot portion of the T-gate structure (i.e. the nakedly exposed portion where the beam passes only through the transparent plate 1), whereas at the head portion of the T-gate structure (i.e. the less exposed portion where the beam passes through the half-tone layer patterns 3 and 3a) the light intensity measured is relatively lower than that of the foot portion.

Figure 1C:
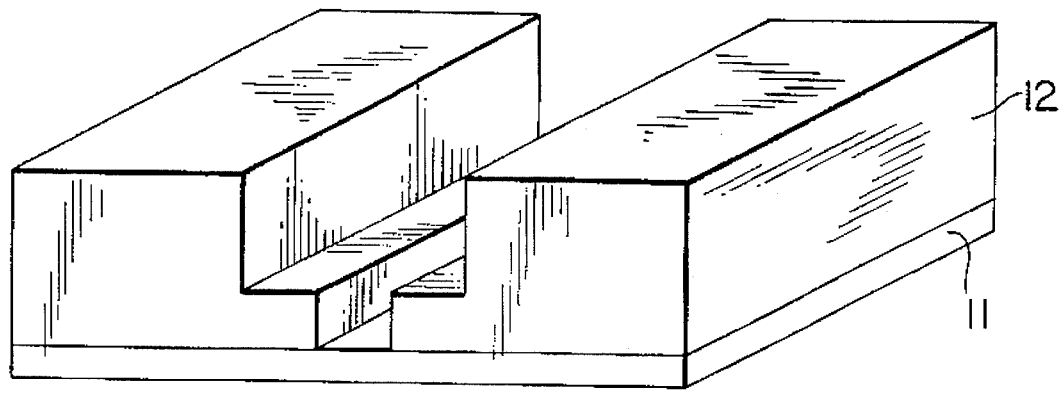
FIG. 1(c) is a profile of a photo resist pattern for forming a T-shaped gate structure.

As apparent from the above description, if the steps of exposure and development are carried using the photomask of the invention in which the transmittance of each head and foot portions of the T-gate structure differs, the resist pattern 12 having such a profile as shown FIG. 1(c) can be obtained with a single step of the photolithography.

Thereinafter, a process for fabricating the photomask according to the invention will be described in detail.

Embodiment 1

FIGS. 1(a) to 1(i) illustrate the cross-sectional views showing a process flow for fabricating the photomask according to one of the preferred embodiments.

Referring to the above drawings, the process flow according to the invention will be described in detail.

Figure 2A:
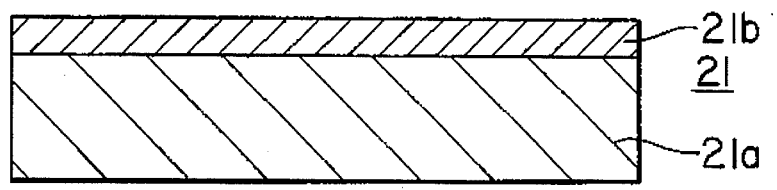
FIGS. 2(a) to (i) are the cross sectional views showing a process flow for fabricating the photomask of the invention.
Figure 2B:
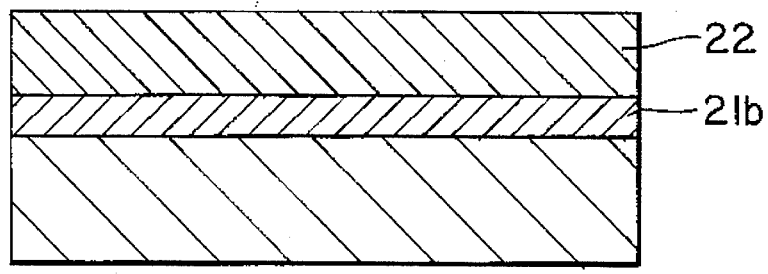

As shown in FIG. 2(a), a conventional blank mask 21 on which a chrome layer 21b is coated to a thickness of about 1000 A is provided.

Next, a positive electron-beam resist 22 is deposited upon the chrome layer 21b and then the thus formed substrate is soft-dry baked.

Figure 2C:
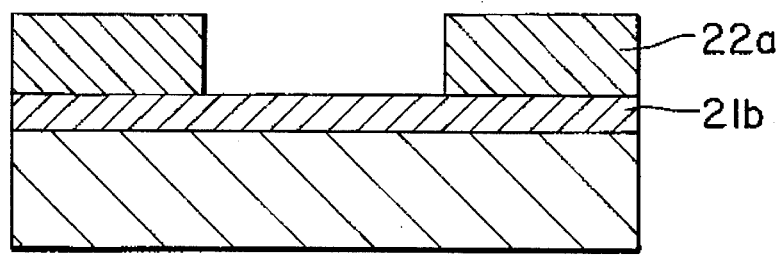

By exposing the head and foot portions of the T-gate structure and the alignment mark portions that will be used in the following steps in the form of a focused electron beam using a conventional electron-beam lithography tool, a resist pattern 22a (hereinafter, mentioned as 'a first resist pattern') as shown FIG. 2(c) is developed and simultaneously surface portions of the chrome layer 21b is uncovered.

Figure 2D:
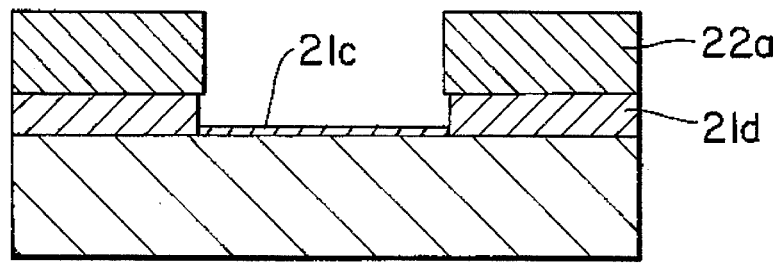

As shown in FIG. 2(d), as the uncovered chrome layer 21b is partially etched away using the first resist pattern 22a as a mask, the half-tone layer 21c where the incident beam is partially intercepted with a low transmittance and the opaque layer 21d are formed respectively. Then, the first resist pattern 22a is removed.

Figure 2E:
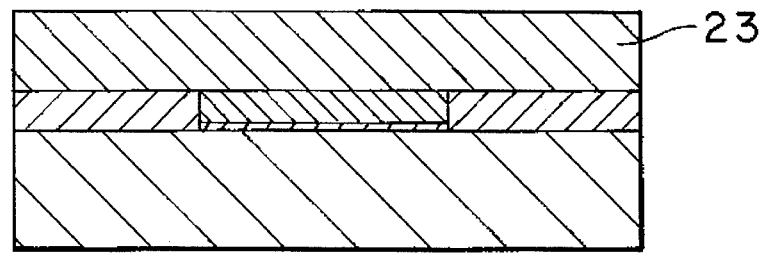

Next as shown in FIG. 2(e), another positive resist 23 is deposited upon the whole surface of the mask 1 and then the mask as treated is soft-dry baked.

Figure 2F:
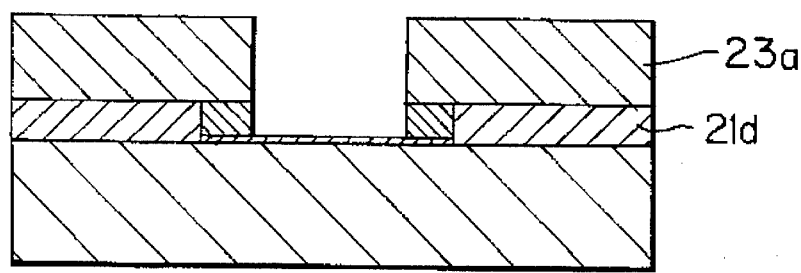

Next, the width corresponding the of a foot portion of the T-gate structure is exposed through an alignment mask and then the resist 23 is developed, thereby forming a resist pattern 23a (hereinafter mentioned as 'a second resist pattern') and simultaneously uncovering surface portions of the half-tone layer 21c as shown in FIG. 2(f).

Figure 2G:
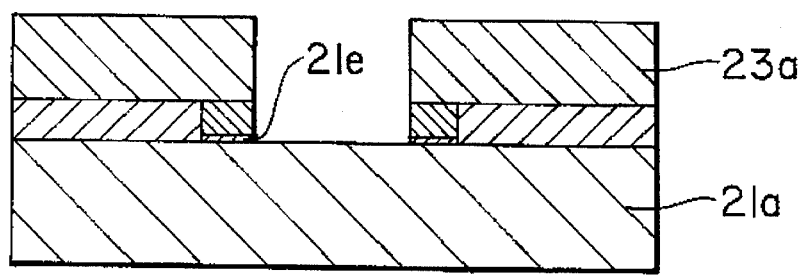

Next as shown in FIG. 2(g), the uncovered surface portion of the half-tone layer is now completely removed using the second resist pattern 23a as a mask to form a second half-tone pattern 21e and thus the surface portions of the transparent quartz plate 21a is uncovered.

Figure 2H:
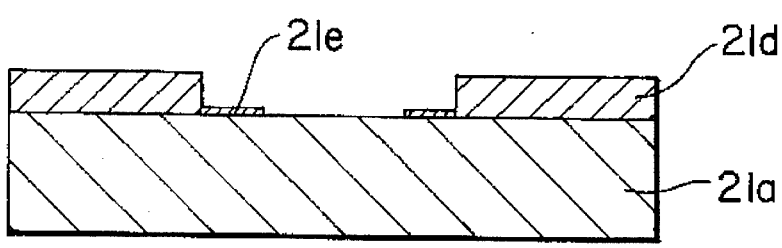

Finally, the second resist pattern 23a is removed to form a photomask having such a gate structure as shown in FIG. 2(h).

Figure 2I:
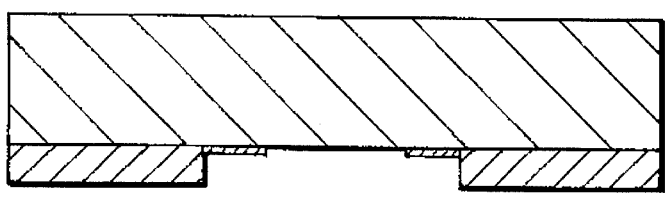

As stated above, the photomask fabricated by the use of the above described process is then turned upside down as shown in FIG. 2(i) and it will be used in the photolithography process for forming FETs having the T-gate structures.

Embodiment 2

In this second embodiment, the process for fabricating the photomask using the photolithography is carried in the same manner as with the first embedment, but instead of employing the steps of FIGS. 2(c) and 2(d), the first resist pattern 22a is first formed and then the uncovered chrome layer 21b is completely etched away, and a half-tone layer comprised of a half-tone polymer and the like is deposited. And subsequently the half-tone layer pattern is formed using the same steps of FIGS. 2(e) to 2(h) thus to fabricate the photomask of the invention.

As described in detail through the above embodiments by applying the photomask to the process for forming the T-gate, it is possible to form a resist profile by employing conventional photolithographic technique, thus increasing the production rate as compared with the case of using an electron-beam lithogaphy. Furthermore, an alignment error between the foot and head portions of the T-gate structure which happened in a conventional double-exposure process can be completely avoided so that far better process reproducibility is expected as compared with a prior art.

In addition, during the formation of the resist patterns, a single exposure step can be applied to a single resist layer and thus the step for forming the T-gate structure can be simplified and this leads to great cost savings in terms of manufacturing while increasing the throughput.

Moreover, in the photolithographic process for forming the T-gate structure using the photomask of the present invention, a positive resist is used so that the residual problem is smaller than that of the conventional lithography which uses a double layer negative resist structure, thus reducing burdens of carrying additional removing step.

What is claimed is:

1. A photomask for forming a T-shaped gate structure on a FET using a negative photoresist comprising:

a transparent quartz plate;

two opaque layer patterns, each pattern being positioned on said quartz plate to a predetermined distance from the edges of said quartz plate in its inward direction, for completely blocking an incident beam to define a head portion of said T-shaped gate structure; and two half-tone layer patterns, each pattern being positioned on said quartz plate to a predetermined distance from the edges of said two opaque layer patterns in its inward direction, for passing an incident beam with a lower transmittance than that of said transparent quartz plate to define a foot portion of said T-shaped gate structure.

2. A photomask of claim 1, wherein said opaque layer patterns 2 and 2a and said half-tone layer patterns 3 and 3a are composed of a chrome layer, said opaque layer patterns 2 and 2a are deposited to a thickness that makes the incident beam be completely blocked, and said half-tone layer patterns 3 and 3a are deposited to a thickness that makes the transmittance thereof higher than that of said opaque layer patterns 2 and 2a but lower than that of said transparent quartz plate 1.

3. A process for fabricating a photomask for forming a T-shaped gate structure on a FET through a photolithographic technique using a negative photo resist comprising the steps of:

providing a blank mask on which a chrome layer 21b is coated to a thickness of about 1000Å and then depositing a positive electron beam resist 22 on said coated chrome layer and then soft-dry baking said positive electron beam resist 22 exposuring an electron beam upon both the head and foot portions of said T-shaped gate structure and the alignment mark portions that will be used in the following steps then to develop said head and foot portions and said alignment mark portions, thereby forming a first resist pattern 22a and simultaneously uncovering surface portions of said chrome layer 21b;

partially etching the uncovered surface portions of said chrome layer 21b using said first resist pattern 22a as a mask, thereby forming a half-tone film 21c through which an incident beam passes with a low transmittance and an opaque layer 21d through which an incident beam is completely blocked;

depositing a positive resist 23 over the whole surface of said mask 1 after removing said first resist pattern 22a, and subsequently soft-dry baking said positive resist 23;

exposuring the width corresponding a foot portion of said T-shaped gate structure through an alignment mask and then developing said resist 23, thereby forming a second resist pattern 23a and simultaneously uncovering surface portions of said half-tone layer 21c; and completely removing the uncovered surface portions of said half-tone layer 21c using said second resist pattern 23a as a mask, thereby forming a half-tone layer pattern 21e and simultaneously uncovering surface portions of said transparent quartz plate 21a and then removing the remaining second resist pattern 23a.

\* \* \* \* \*